(12) United States Patent
Mathai et al.

(10) Patent No.: US 8,446,661 B2
(45) Date of Patent: May 21, 2013

(54) TUNABLE NANOWIRE RESONANT CAVITY FOR OPTICAL MODULATION

(75) Inventors: Sagi Varghese Mathai, Berkeley, CA (US); Alexandre M. Bratkovski, Mountain View, CA (US); Wenhua Zhang, Sunnyvale, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 67 days.

(21) Appl. No.: 13/058,495

(22) PCT Filed: Aug. 26, 2008

(86) PCT No.: PCT/US2008/074348
§ 371 (c)(1), (2), (4) Date: Feb. 10, 2011

(87) PCT Pub. No.: WO2010/024803
PCT Pub. Date: Mar. 4, 2010

(65) Prior Publication Data
US 2011/0141546 A1 Jun. 16, 2011

(51) Int. Cl.
*G02B 26/00* (2006.01)
(52) U.S. Cl.
USPC .................................................... 359/290
(58) Field of Classification Search
USPC ............... 359/290, 291, 292, 295, 237, 245, 359/260, 248; 257/14
See application file for complete search history.

(56) References Cited

U.S. PATENT DOCUMENTS

| 6,465,132 | B1 | 10/2002 | Jin | |
|---|---|---|---|---|
| 7,235,475 | B2 | 6/2007 | Kamins | |
| 7,332,736 | B2 * | 2/2008 | Jin | 257/10 |
| 8,039,834 | B2 * | 10/2011 | Wang et al. | 257/43 |
| 2007/0252132 | A1 | 11/2007 | Kamins et al. | |
| 2008/0067618 | A1 | 3/2008 | Wang et al. | |
| 2008/0181551 | A1 | 7/2008 | Wang | |

FOREIGN PATENT DOCUMENTS

| JP | 2006-526803 | 11/2006 |
|---|---|---|
| JP | 2007-504504 | 3/2007 |
| JP | 2008-506212 | 2/2008 |

* cited by examiner

*Primary Examiner* — Tuyen Tra

(57) ABSTRACT

A resonant cavity with tunable nanowire. The resonant cavity includes a substrate. The substrate is coupleable to an optical resonator structure. The resonant cavity also includes a plurality of nanowires formed on the substrate. The plurality of nanowires is actuated in response to an application of energy.

16 Claims, 14 Drawing Sheets

TUNABLE NANOWIRE RESONANT CAVITY FOR OPTICAL MODULATION

BACKGROUND

An optical resonator, also referred to as a resonant optical cavity, is a configuration of optical components that enable circulation of light, with or without a gain medium, within a particular path.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF EMBODIMENTS

Reference will now be made in detail to embodiment(s) of the present invention. While the invention will be described in conjunction with the embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following description of embodiments of the present invention, numerous specific details are set forth in order to provide a thorough understanding of the present invention. However, it will be recognized by one of ordinary skill in the art that the present invention may be practiced without these specific details. In other instances, well known methods, procedures, and components have not been described in detail as not to unnecessarily obscure aspects of the present invention.

Figure 1A:
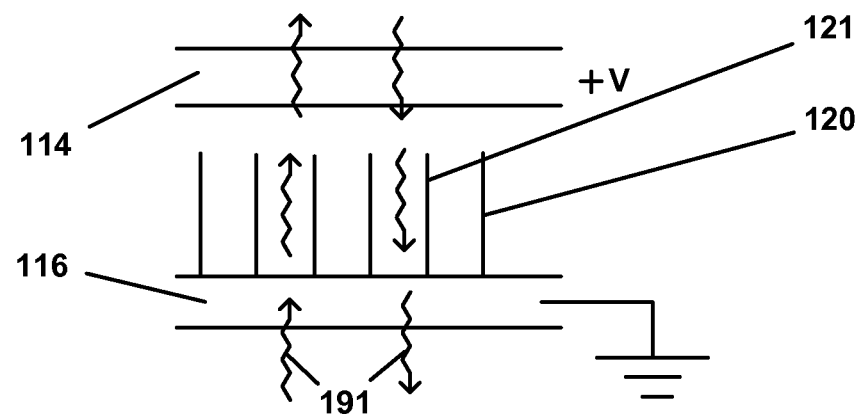
FIG. 1A is a block diagram of a portion of the components of an optical cavity with one or more nanowires in a transmissive position, in accordance with an embodiment of the present invention.
Figure 1B:
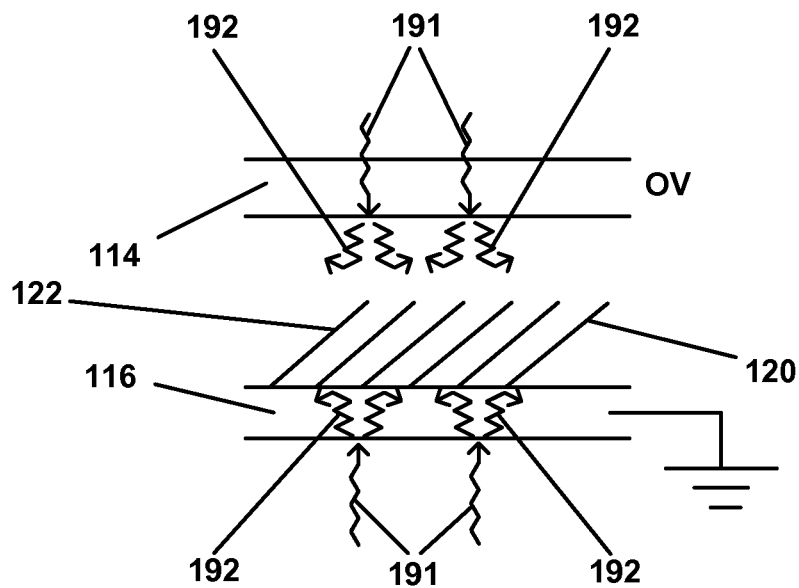
FIG. 1B is a block diagram of the optical cavity of FIG. 1A depicting the one or more nanowires in a non-transmissive position.

FIG. 1A is a block diagram of an exemplary device 110 that is configured with one or more nanowires, in accordance with an embodiment of the present invention. Device 110 is shown to include one or more single nanowires 120 (each indicated by a straight line) disposed therewithin. Device 110 is shown to have a first substrate, e.g., electrode 114, and a second substrate, e.g., electrode 116. In the present embodiment, each substrate is configured as an electrode. In the present embodiment, nanowires 120 may be grown on electrode 114 or electrode 116. In alternative embodiments of the present invention, nanowires 120 may be grown on a substrate and then coupled to an electrode, as shown in FIGS. 2A-2B, 3A-3C and 4A-4B. Electrodes 114 and 116 may be biased as shown in FIG. 1A, or biased as shown in FIG. 1B, in an embodiment of the present invention. In accordance with an embodiment of the present invention, nanowires 120 are responsive to an applied energy, e.g., through electrodes 114 and 116, also shown in FIG. 1B.

In an embodiment of the present invention, nanowires 120 may be grown on an electrode, e.g., electrode 114 or 116. In accordance with various embodiments of the present invention as shown in the following figures, each of the single nanowires 120, 220, 320, 420 and 520 are grown on one surface, e.g., electrode substrate 116 and substrates 230, 330, 430 and 530, of FIGS. 2A, 3A, 4A and 5A, respectively. In the present embodiment, nanowires 120 have been grown on electrode 116. In an alternative embodiment of the present invention, nanowires 120 may be grown on electrode 114.

Still referring to FIG. 1A, in an embodiment of the present invention, electrode 114 and/or 116 may be comprised of silicon, e.g., GaAs, InP, or other single crystal material or polycrystalline silicon, amorphous silicon, poly-crystal diamond and/or other carbon materials, and/or microcrystalline silicon using a mold or grown such that all the nanowires 120 are oriented in the same direction. In an embodiment of the present invention, each single nanowire 120 is grown from electrode 116. In alternative embodiments of the present invention, germanium, indium phosphide or other suitable material, or a combination of materials, may be used in the fabrication of electrodes 114 and 116 and nanowires 120. In an embodiment of the present invention, nanowires 120 may be exteriorly clad, e.g., encased in gold or other conductive and/or optically reflective material. In accordance with embodiments of the present invention, each single nanowire 120 is configured with a length of at least one wavelength. The nanowire spacing to adjacent nanowire is less than a wavelength and may be randomly distributed or distributed in a periodic or aperiodic manner. The nanowires 120 may be oriented perpendicular or at an angle relative to the surface of substrate 116.

Figure 2A:
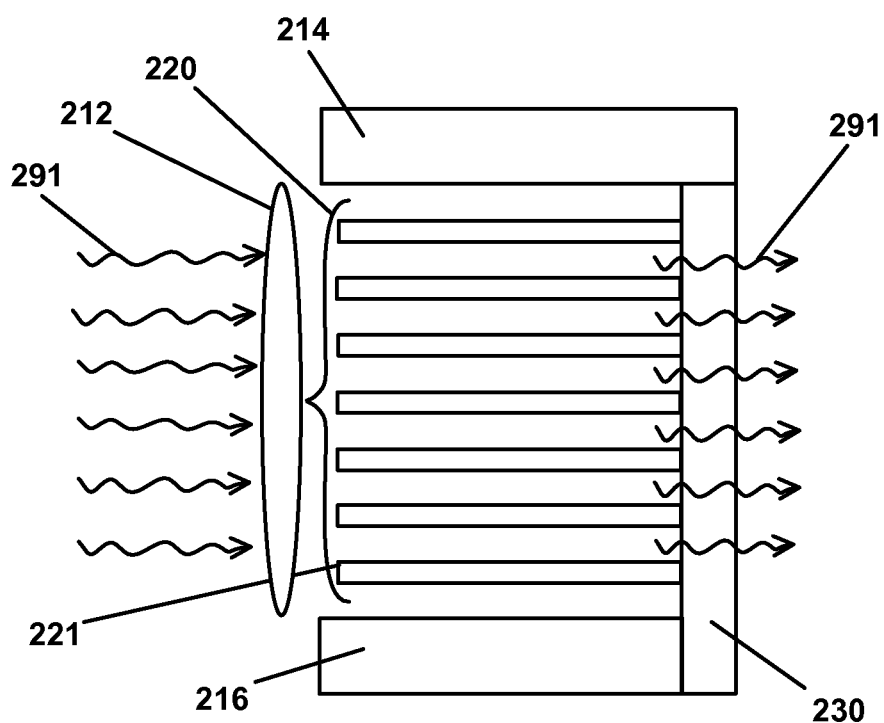
FIG. 2A is a block diagram of a portion of the components of an optical cavity with one or more nanowires, in accordance with another embodiment of the present invention.
Figure 2B:
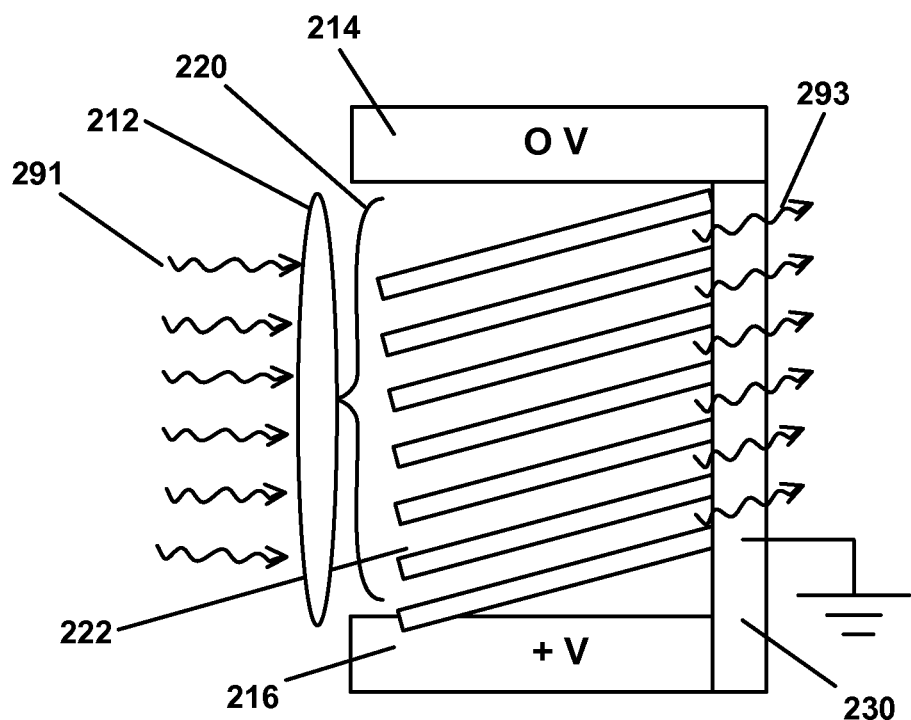
FIG. 2B is a block diagram of the optical cavity of FIG. 2A depicting the one or more nanowires in a splitting position.
Figure 4A:
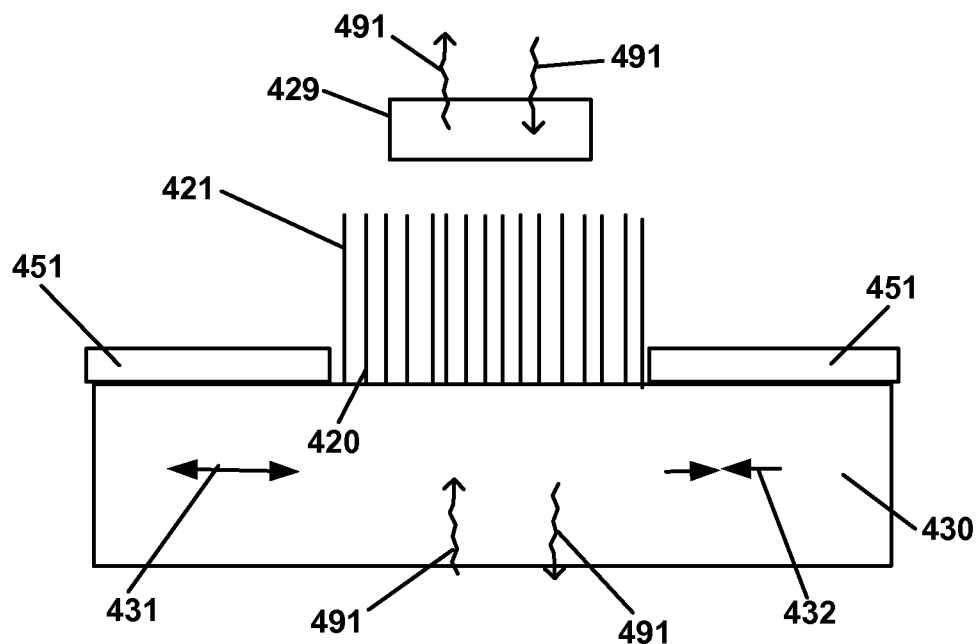
FIG. 4A is a block diagram of a portion of the components of an optical cavity having one or more tunable nanowires configured for a tunable filter or color filtration and shown in a reflective position having a particular effective refractive index, in accordance with still another embodiment of the present invention.
Figure 4B:
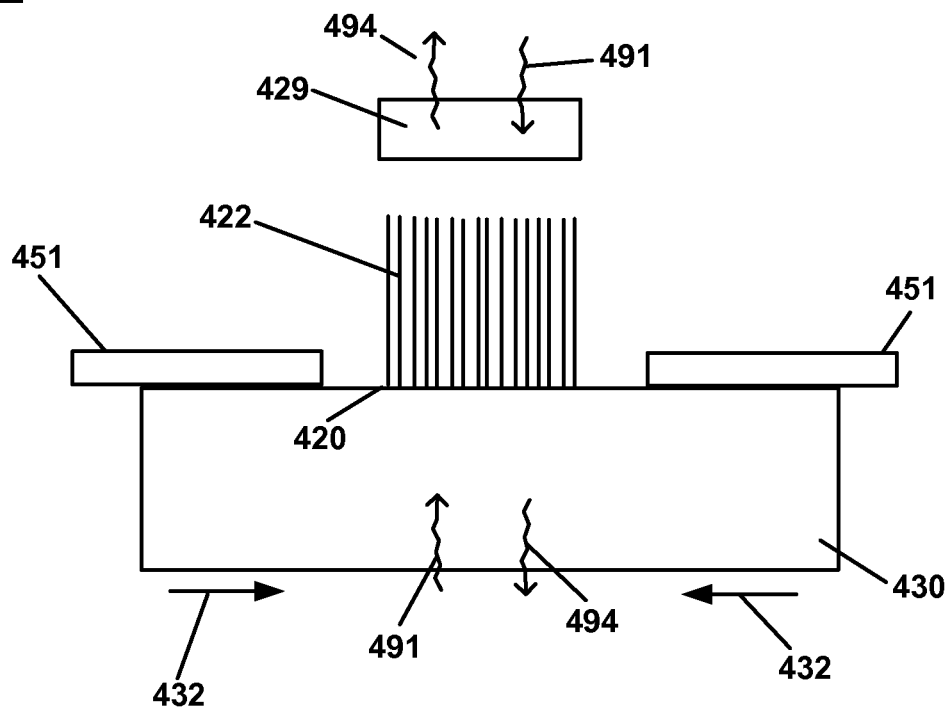
FIG. 4B is a block diagram of the one or more tunable nanowires of FIG. 4A configured for a tunable filter or color filtration shown in an increased effective refractive index position.
Figure 5A:
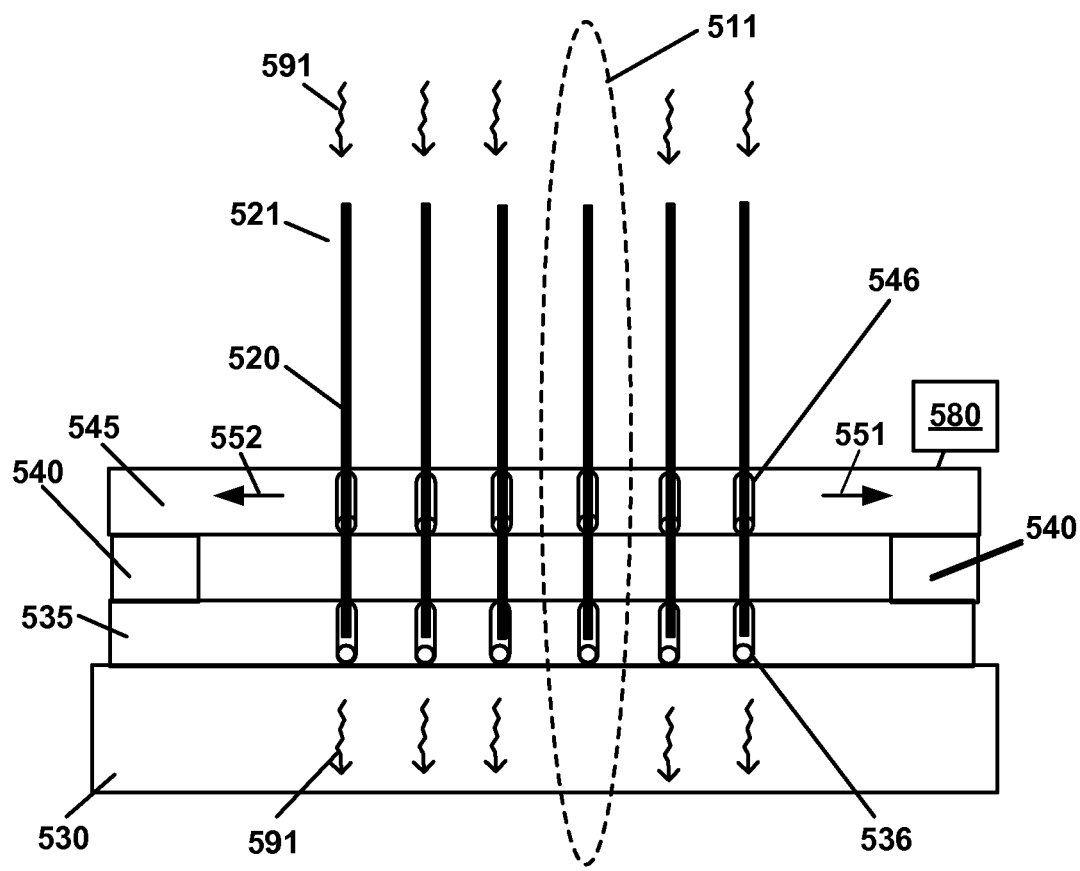
FIG. 5A is a block diagram of a portion of the components of an optical cavity with one or more movable nanowires shown in a transmissive position, in accordance with still yet another embodiment of the present invention.
Figure 5B:
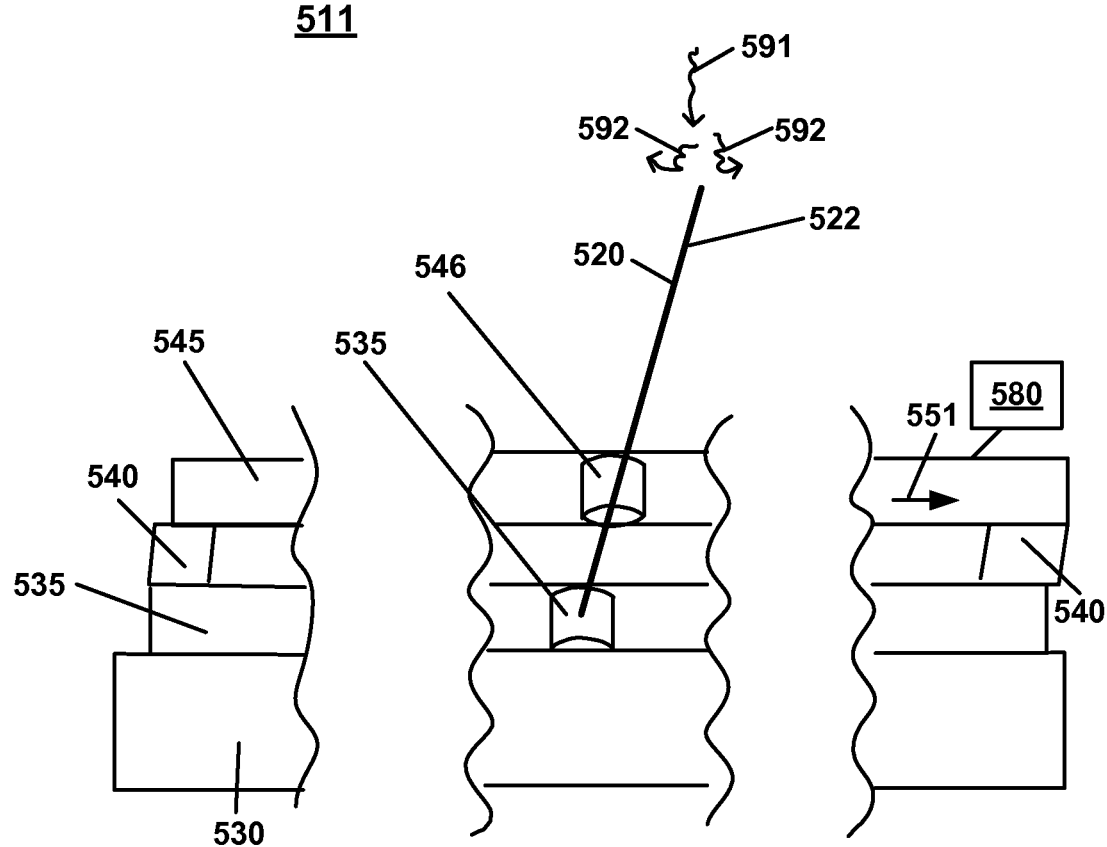
FIG. 5B is a block diagram of one of the movable nanowires of FIG. 5A shown in a deflecting position.

Once fabricated, nanowires 120 of device 110 may be configured to provide various functions. In an embodiment of the present invention, nanowires 120 may be utilized as an optical modulator whereby deflecting the nanowire in the resonator, the optical Q can be degraded. Alternatively, as light transits the modulator or optical cavity, nanowires deflected from the optical axis will increase optical loss by deflecting light away from the optical axis and into the wall of the optical cavity, thus losing the light, as shown in FIGS. 1A-1B and FIGS. 3A-3C. In another embodiment of the present invention, nanowires 120 may be utilized as a beam splitter with reflective nanowires, as shown in FIGS. 2A and 2B. In yet another embodiment of the present invention, a nanowire 120 may be configured for optical modulation in which a plurality of nanowires 120 may be formed on a substrate that is subject to a spatial change, such that the density of nanowires 120 is variable, as shown in FIGS. 4A and 4B. As shown in FIGS. 4A and 4B, nanowires 120 having variable density provides for adjustable effective refractive index, when nanowire spacing is less than a wavelength of the light. In still yet another embodiment of the present invention, a nanowire 120 may configured for optical modulation in which a nanowire is oriented into a modulating position along the vertical axis via mechanical device implementation, as shown in FIGS. 5A and 5B. In yet still another embodiment of the present invention, nanowire 120 may be implemented as a color filtration device, as shown in FIGS. 4A-4B and 6A-6B.

Still referring to FIG. 1A, electrode 114 is shown to have had applied thereto an energy, e.g., voltage, such that electrode 114 comprises a higher voltage, effectively becoming a positive electrode, than electrode 116, effectively becoming a ground electrode. In an embodiment of the present invention, when electrode 114 is the positive electrode, nanowires 120 are drawn to the more positive electrode 114, in response to the applied energy, such that high transmissivity of beam 191 is achieved. In the present embodiment, nanowires 120 are oriented in a vertical position 121, relative to the horizontal axis of electrode 116, to achieve high transmissivity of beam 191. It is noted that in single pass operation, the deflection of the nanowire acts as a shutter, whereas in a multi-pass operation, e.g., as in a resonator, the nanowire deflection acts as a Q-spoiler of the resonant cavity, thus also modulating the signal.

Beams 191, 291, 391, 491 and 591 of FIGS. 1A-1B, 2A-2B, 3A-3C, 4A-4B, 5A-5B, respectively, may, or may not, interact with a gain medium implemented in conjunction with device 110. Types of gain medium implementable in device 110 can include, but which is not limited to semiconductors, a type of solid in which the movement of electrons of differing dopant level materials can cause laser action. It is noted that a nanowire 120, when fabricated from III-V semiconductor materials, can also have gain such that by deflecting the nanowire, the beam interacts more with the nanowire gain via multiple bounces and trapping of the light within the nanowires. Deflection of the nanowires from the optical axis thus varies the gain seen by the light beam, also resulting in modulation. In this instance, the nanowires are optically pumped to acquire gain, or both ends of the nanowires are electrically terminated to pump electrical current through the nanowires. The nanowires may be doped with pn junctions and fabricated in a hetero-junction geometry for efficient gain.

FIG. 1B is a block diagram of device 110 of FIG. 1A in which nanowires 120 are in a neutral state, such that an equal amount of energy or no voltage is applied to electrode 114 and electrode 116, in an embodiment of the present invention. As no voltage differential exists between electrode 114 and electrode 116, nanowires 120 return to a relaxed state. In the relaxed state, indicated as position 122, nanowires are in an off-optical axis orientation, such that nanowires 120 are not aligned in parallel with the optical beam 191 and/or are not aligned perpendicular relative to the horizontal axis of electrode 114. Nanowires 120 oriented in a diagonal position 122, provide a reduction in the transmissivity of beam 191, indicated as beam 192.

FIG. 2A is a cross-sectional block diagram of device 210 implemented as a beam splitter, in accordance with an embodiment of the present invention. Device 210 is shown to include an optional focusing lens 212 coupled there with. In an embodiment of the present invention, focusing lens 212 is configured for focusing an optical beam, e.g., beam 291. It is noted that although a focusing lens 212 is shown in FIGS. 2A and 2B, a focusing lens 212 may or may not be similarly implemented in devices 110, 310, 410, 510, 610 and 611 of FIGS. 1A-1B, 3A-3C, 4A-4B, 5A-5B and 6A-6B, respectively, in accordance with various embodiments of the present invention. Device 210 further includes a substrate 230 upon which are formed an electrode 214 and an electrode 216. Also shown is a plurality of individual nanowires 220, each indicated as a straight line. In an embodiment of the present invention, substrate 230 may be comprised of silicon, e.g., polycrystalline silicon, amorphous silicon, poly-crystal diamond and/or other carbon materials, and/or microcrystalline silicon, in non-single crystal material. All of the nanowires 220 are aligned in the same direction. Nanowires 220 may be grown on the substrate or etched using various micro-fabrication techniques. In alternative embodiments of the present invention, germanium, indium phosphide or other suitable III-V material, or a combination of materials, may be used in the fabrication of substrate 230. In an embodiment of the present invention, nanowires 220 may be grown on substrate 230 of analogous material. In an alternative embodiment, nanowires 220 may be comprised of a differing material or combination of materials.

Nanowires 220 of device 210 are depicted in a neutral state, in which electrode 214 and electrode 216 are not energized, e.g., no voltage has been applied to either electrode 214 or electrode 216, in an embodiment of the present invention. As no energy has been applied, e.g., no voltage differential is present, nanowires 220 are aligned in a pass through position 221, e.g., parallel with the optical axis of beam 291 or perpendicular to the vertical axis of substrate 230, such that beam 291 passes through device 210 with minimum insertion loss.

FIG. 2B is a cross-sectional block diagram of device 210 of FIG. 2A subsequent to energy applied to electrode 216, in an embodiment of the present invention. When voltage is applied between the electrode 216 and nanowires 220, nanowires 220 are drawn to the fixed electrode 216. When voltage is applied between the electrode 214 and nanowires 220, nanowires 220 are drawn to electrode 214 (not shown).

In the present embodiment, substrate 230 and electrode 214 are shown exhibiting no voltage differential, e.g., substrate 230 is shown as a ground and electrode 214 is shown having zero volts applied thereto. By virtue of electrostatic force being an attractive force regardless of the voltage polarity applied between objects, in the present embodiment electrode 214 and substrate 230 are configured to exhibit no voltage differential. If electrode 214 has a voltage different than substrate 230, those nanowires 220 nearer electrode 214 would sense the electromagnetic force and would be attracted to electrode 214 while those nanowires 220 nearer electrode 216 would be attracted to electrode 216. In the present embodiment, electrode 216 has had applied thereto an amount of energy, e.g., voltage, such that nanowires 220 are drawn to electrode 216. In the present embodiment, nanowires 220 are attracted to electrode 216 having voltage applied thereto, such that nanowires 220, which may or may not be configured with a reflective coating, e.g., a dielectric and/or a metal, are in a beam splitting position 222. Alternatively, nanowires 220 may be attracted to electrode 214 when voltage is applied to electrode 214 and no voltage differential exists between substrate 230 and electrode 216. As beam 291 passes through device 210, nanowires 220, in beam splitting position 222, split beam 291, shown exiting device 210 as beam 293. In the present embodiment, when the voltage applied to electrode 216 is removed, nanowires 220 return to their neutral position, as shown in FIG. 2A.

Figure 3A:
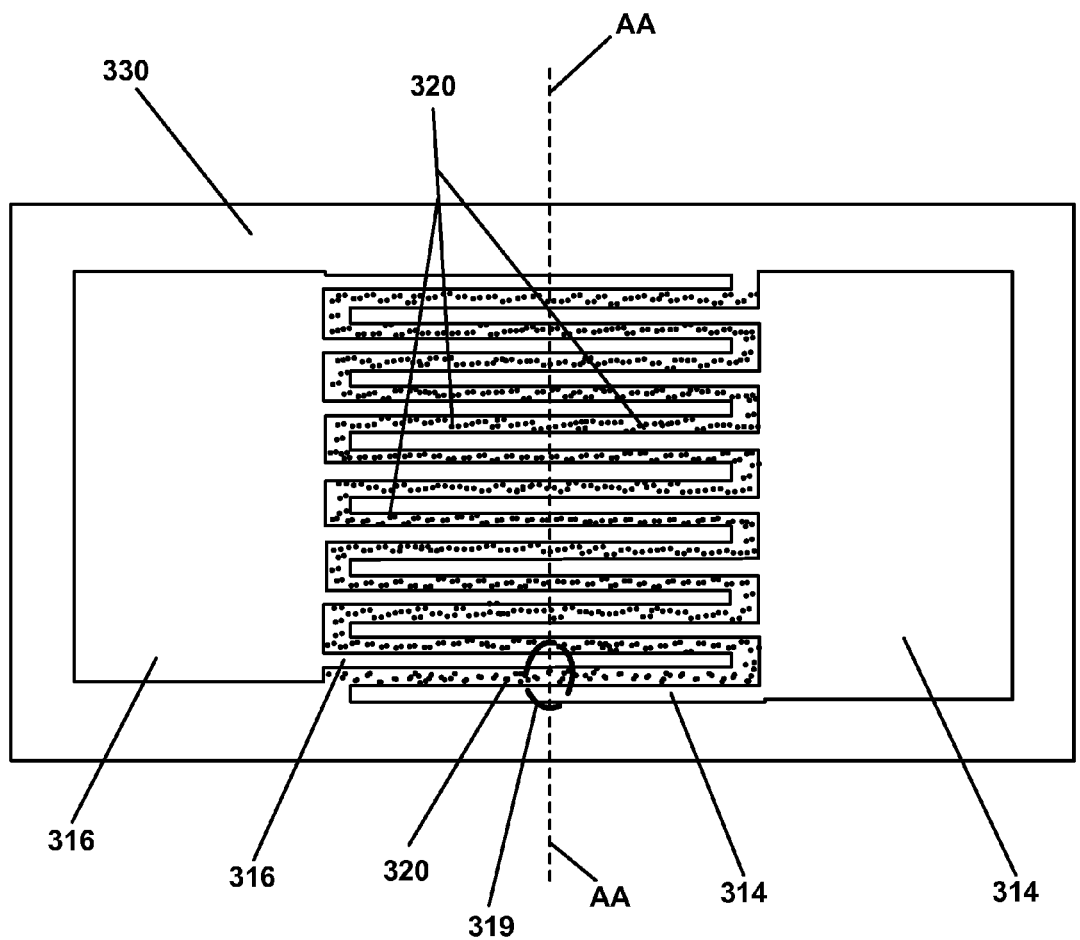
FIG. 3A is a block diagram of a portion of the components of an optical cavity with one or more tunable nanowires, in accordance with yet another embodiment of the present invention.

FIG. 3A is a block diagram of a device 310 configured for optical modulation in an embodiment of the present invention. Device 310 is shown to include a substrate 330. Substrate 330 may, in an embodiment of the present invention, be a silicon-on-insulator type substrate, commonly referred to as SOI. Silicon on insulator technology (SOI) refers to layered silicon-insulator-silicon substrate in place of conventional silicon substrates. SOI-based devices differ from conventional silicon-built devices in that the silicon junction is above an electrical insulator, typically silicon dioxide. Alternatively, other materials providing analogous properties and characteristics to that of SOI substrate 330 may be implemented within or as substrate 330. In the present embodiment, substrate 330 is shown to include an electrode 314 and an electrode 316, each electrode having digits extending there from. Randomly and uniformly interposed between electrode 314 digit and electrode 316 digit are a plurality of individual nanowires 320. In an embodiment of the present invention, nanowires 320 are grown from substrate 330. It is particularly noted that although FIG. 3A depicts nanowires 320 somewhat interposed between each electrode digit, it is noted that, in an embodiment of the present invention, nanowires 320 are interwovenly grown about each electrode 314 digit and electrode 316 digit.

In an embodiment of the present invention, nanowires 320, as well as nanowires 120 and 220 of FIGS. 1A-1B and 2A-2B, respectively, may be grown in a random arrangement, as particularly shown in FIG. 3A. It is noted that nanowires 120 of FIG. 1A, nanowires 220 of FIG. 2A, nanowires 420 of FIG. 4A, nanowires 520 of FIG. 5A and nanowires 620 of FIG. 6 may also be grown in a random arrangement. In an alternative embodiment of the present invention, nanowires 120, 220, 320, 420, 520 and 620 may be grown in an ordered pattern.

Figure 3B:
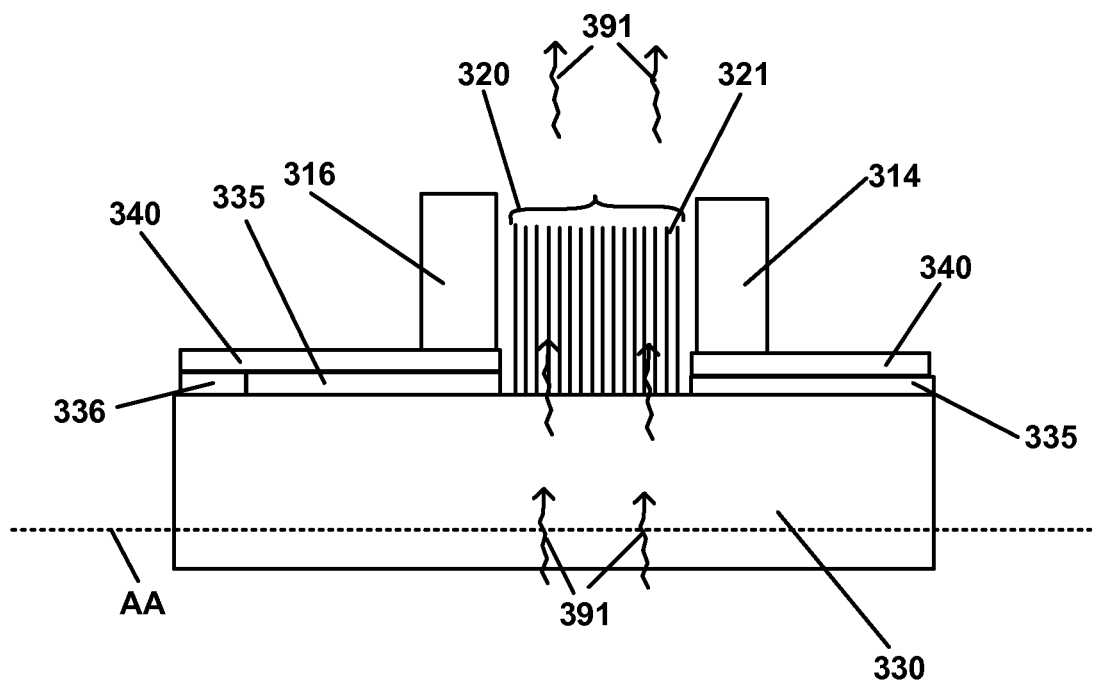
FIG. 3B is a block diagram of the one or more nanowires of FIG. 3A shown in a transmissive position.
Figure 3C:
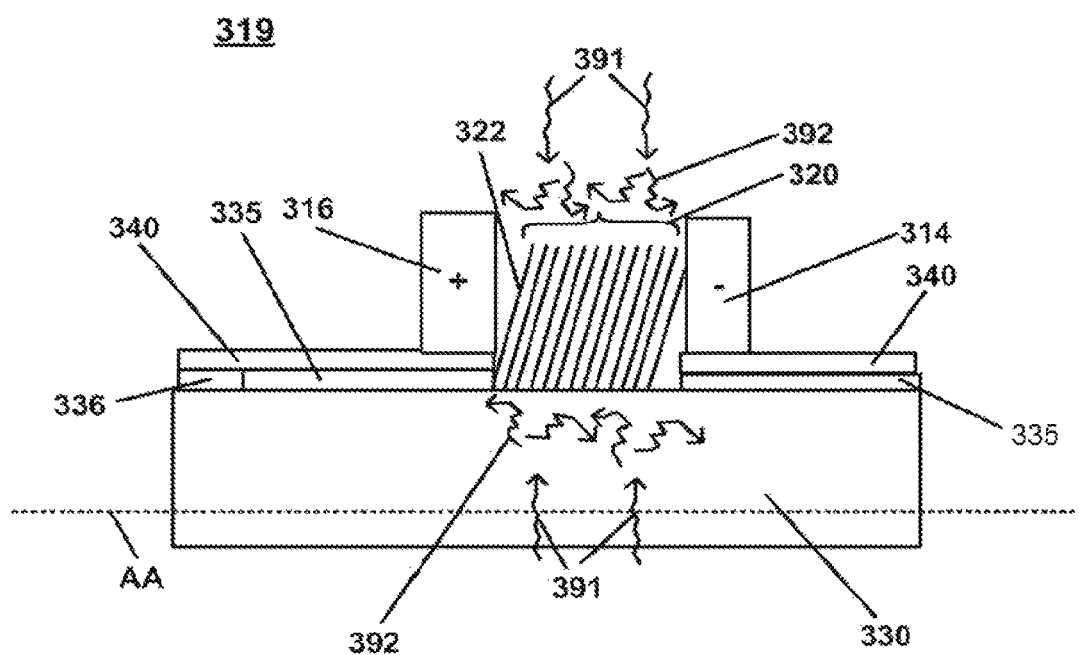
FIG. 3C is a block diagram of the one or more nanowires of FIG. 3A shown in a non-transmissive position.

Still referring to FIG. 3A, included is a region 319 containing a random arrangement of nanowires 320, which is described herein with reference to FIGS. 3B and 3C, in an embodiment of the present invention. It is noted that locations and quantities of nanowires 120 depicted herein are exemplary in nature and, as such, are not to be construed as a limitation. FIG. 3A further includes a cross section AA, as described herein with reference to FIGS. 3B and 3C, in an embodiment of the present invention.

FIG. 3B is an expanded view cross-sectional block diagram of line AA of region 319 of device 310 of FIG. 3A in an embodiment of the present invention. Substrate 330 of device 310 is shown to include a spacer 335 layer interposed between insulator layer 340 and substrate 330, in an embodiment of the present invention. A conductive layer 336 is shown interposed between insulator layer 340 and substrate 330. Nanowires 320, grown from substrate 330, may be coupled to either electrode 314 or electrode 316. In the present embodiment, nanowires 320 are coupled to electrode 316. Electrodes 314 and 316 have had applied thereto an analogous amount of energy, e.g., voltage, or no energy, such that a neutral state is in effect. Nanowires 320, responsive to equally applied or no energy, are shown oriented in a transmissive position 321, such that a beam 391 is substantially unaffectedly refracted.

FIG. 3C is an expanded view cross-sectional block diagram of line AA of region 319 of device 310 of FIG. 3A in which nanowires 320 are oriented in a reduced transmissivity position 322, such that beam 391 experiences increased optical loss, indicated by beam 392, in transmission, in accordance with an embodiment of the present invention. Electrode 316 has had an amount of energy, e.g., voltage, applied thereto, that is a greater amount of energy than the amount of energy that has been equally applied, or no energy has been applied, to electrode 314 and substrate 330. In the present embodiment, and in response to the applied energy, nanowires 320 are attracted to the electrode having a lesser amount of energy applied thereto. Alternatively, nanowires 320 may be configured to be attracted to the electrode that has a greater amount of energy applied thereto.

FIG. 4A is a block diagram of a device 410 configured for variable effective refractive index, in an embodiment of the present invention. Device 410 is shown to include a substrate 429, a substrate 430, a plurality of individual nanowires 420, and a support 451. In an embodiment of the present invention, substrate 429 is a dimensionally stable substrate as described herein with reference to substrates 114, 116, 230, 330, 530 and 630. In an embodiment of the present invention, substrate 430 is shown to have had grown thereon a plurality of individual nanowires 420, as described herein with reference to FIGS. 1A-1B, 2A-2B, and 3A-3C. In an embodiment of the present invention, substrate 430 is configured to be dimensionally flexible, such that substrate 430 can expand and contract in response to an applied energy, e.g., voltage, when substrate 430 is, but is not limited to, a PZT substrate. For example, substrate 430 may expand in response to a particular applied voltage, as indicated by arrow 431, or contract in response to another particular voltage, as indicated by arrow 432. The expansion and contraction of a PZT substrate effectively changes the density of the nanowires (per unit area) and thus changes the effective refractive index seen by the optical beam. This can change the color of the element, such that if the light source is white light, the reflection (from a cavity) or transmission can be of a different color. The nanowires form part of a tunable optical filter consisting of an optically transparent cavity and a variable refractive index medium inside the cavity.

As such, when dimensional change of substrate 430 occurs, the density of the nanowire (per unit area) changes and, accordingly, the effective refractive index. By virtue of nanowires 420 grown on substrate 430, the density of nanowires 420 can change in relation to the expansion or contraction of substrate 430. FIG. 4A depicts nanowires 420 in a transmissive state 421.

FIG. 4B is a block diagram of device 410 illustrating a dimensional change of substrate 430 in response to energy applied thereon, e.g., voltage, causing substrate 430 to contract, as indicated by arrow 431. In accordance with an embodiment of the present invention, the density of nanowires 420 has increased, e.g., nanowire spacing has decreased, in response to the contraction of substrate 430. FIG. 4B depicts nanowires 420 in an increased density position 423, resulting in a change in refractive index. The change in density of nanowires changes the effective refractive index and tunes the filter/resonator a different color/wavelength. As the nanowire spacings are sub wavelength, color filtration occurs, such that beam 491 is filtered, indicated as beam 494.

The effective refractive index, as depicted in FIG. 4B, is greater than the refractive index as shown in FIG. 4A. The nanowires are spaced less than a wavelength from adjacent nanowires. An optical cavity with a tunable index inside the cavity may be implemented as a tunable optical filter.

It is noted that in an alternative embodiment of the present invention, functions and features of device 110 and/or 210 and/or 310 may be combined with device 410, such that the density and the amount of refraction of the nanowires is variable.

FIG. 5A is a block diagram of a device 510 implemented as a waveguide modulator and configured to mechanically move the nanowires by moving plates, e.g., using a PZT substrate, in an embodiment of the present invention. Device 510 includes a plurality of nanowires 520. In an embodiment of the present invention, nanowires 520 may be analogous to nanowires 120, 220, 320 and 420, as described herein with reference to FIGS. 1A-1B, 2A-2B, 3A-3C and 4A-4B. Device 510 further includes a substrate 530. In an embodiment of the present invention, substrate 530 may be analogous to substrate 110, 210 or 310 as described herein with reference to FIGS. 1A-1B, 2A-2B and 3A-3C, respectively. Substrate 530 is shown to have a base member 535 formed thereon. In an embodiment of the present invention, base member 535 may be comprised of a polymer/silicon. Base member 535 is shown to have disposed therewithin an opening 536 for each nanowire 520 and through which a nanowire 520 is grown or inserted and supported.

Shown disposed on base member 535 are two flexible spacers 540, in an embodiment of the present invention. Flexible spacers 540 flex in response to movement of hinge member 545. Flexible spacers 540 are shown interposed between base member 535 and hinge member 545. Hinge member 545 is shown to have disposed therewithin an opening 546 for each nanowire 520.

In an embodiment of the present invention, hinge member 545 may be comprised of a polymer. Hinge member 545 is, in an embodiment of the present invention, movement enabled, as indicated by arrows 551 and 552, such that the positional alignment of nanowire 520 is affected thereby. In an embodiment of the present invention, movement of hinge member 545 is actuated by a MEMs (micro-electro-mechanical) device 580 coupled to hinge member 545. Other devices for causing movement of hinge member 545 may be implemented, e.g., a PZT substrate, in alternative embodiments of the present invention. In the present embodiment, nanowires 520 are shown in a passive position 521, such that beam 591 substantially unaffectedly flows through device 510. FIG. 5A also includes a region 511, as described herein with reference to FIG. 5B.

FIG. 5B is an expanded view block diagram of region 511 of device 510 of FIG. 5A. In response to a signal from MEMs 580, hinge member 545 has moved laterally, as indicated by arrow 551. In accordance with an embodiment of the present invention, movement 551 of hinge member 545 causes motion to be applied to nanowire 520, proximal to opening 546, causing nanowire 520 to be oriented in non-parallel position, e.g., a modulating position 522, relative to the path of beam 591. A non-parallel position, also referred to as off-optical path, enables deflection, e.g., modulation, of beam 591, shown as beam 592. It is noted that in the embodiment shown, hinge member 545 is oriented near base member 535. In alternative embodiments of the present invention, hinge member 545 may be oriented anywhere along the long axis of nanowire 520, being located nearer to or farther away from base member 535.

Figure 6A:
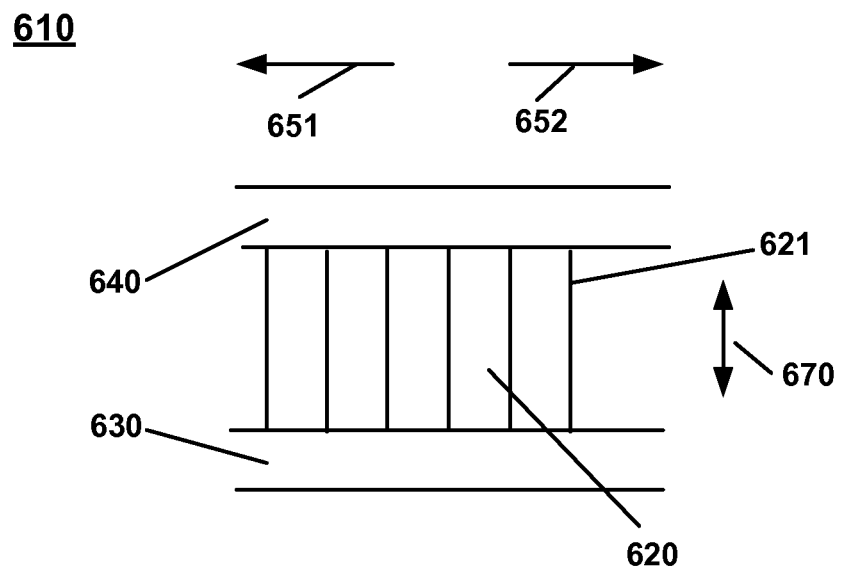
FIG. 6A is a block diagram of an optical cavity for color filtration and having one or more moveable nanowires, in an embodiment of the present invention.

FIG. 6A is a block diagram of an optical resonator 610 having one or more nanowires and configured for color filtration and/or as a tunable optical filter, in accordance with still yet another embodiment of the present invention. In the present embodiment, resonator 610 is a Fabry Perot resonator. FIG. 6A includes a substrate 630 and a substrate 640 from which are grown one or more nanowires 620, in an embodiment of the present invention. In an embodiment, substrate 630 may be, but is not limited to, fabricated in a manner similar to substrates 114, 116, 230, 330 and 530. In an embodiment of the present invention, substrate 640 may be, but is not limited to, fabricated in a manner similar to substrate 545 of FIGS. 5A and 5B, such that substrate 640 may be a movement enabled substrate. In an embodiment of the present invention, substrate 640 may be a PZT substrate. In an alternative embodiment, substrate 640 movement may be actuated by a MEMs coupled therewith. In an embodiment of the present invention, substrate 640 may be fabricated in a manner to substrate 430, as described herein with reference to FIGS. 4A and 4B, such that the density of nanowires 620 is variable. In the present embodiment, substrate 630 is a fixed substrate and substrate 640 is a moveable substrate, configured with lateral movement, indicated by arrows 651 and 652. In alternative embodiments of the present invention, substrate 640 may be a fixed substrate and substrate 630 may be a moveable substrate.

In accordance with an embodiment of the present invention, resonator 610 transmits well defined discreet optical frequencies, e.g., red, green or blue (RGB). In an embodiment of the present invention, the variable effective index of refraction is accomplished by changing the optical path through the nanowires. By changing the orientation of the nanowires, the optical path through the nanowires is also changed, thus changing the effective reflective index. As shown in FIG. 6A, the light sees the full length of the nanowires, indicated as position 621, whereas in FIG. 6B the light sees a different path through the nanowires, thus resulting in a different refractive index. The nanowire spacing to adjacent nanowires is much less than a wavelength. As such, RGB frequencies can be tuned and/or filtered when resonator is a tunable optical filter. Nanowires 620 may be utilized to tune the resonant frequency by controlling their material composition, their density, such that a higher density will red shift the resonant frequency, and/or the length of the nanowires 620, shown as arrow 670.

Still referring to FIG. 6A, by providing a variable refractive index, embodiments of the present invention can enable arrays of RGB filters to be formed on the same substrate. This enables an optical cavity 610 to continuously tune from red to green to blue, so that a single image sensor pixel can distinguish red, green, and blue light, in comparison with current color filters in which each color filter, e.g., RGB, is registered with a corresponding image sensor pixel. The nanowires in FIG. 6A can be either attached on both ends, e.g., substrate 630 and substrate 640, or attached on a single end, either substrate 630 or substrate 640. In the embodiment shown, nanowires 620 are attached on both substrate 630 and substrate 640. Forming arrays of RGB filters on the same substrate provide RGB color filtration by adjusting the density, as shown and described herein with reference to FIGS. 4A-4B. By mechanically actuating nanowires 620 in optical cavity 610, e.g., lengthening, bending, tilting, or increasing the density of nanowires 620, via moveable substrate 640, the resonant frequency can be dynamically shifted from red to green to blue. In an alternative embodiment, the nanowires may be configured as actuators anchored to substrate 630, in which case, the nanowires are actuated to move a mass attached to the nanowires, e.g., substrate 640.

Figure 6B:
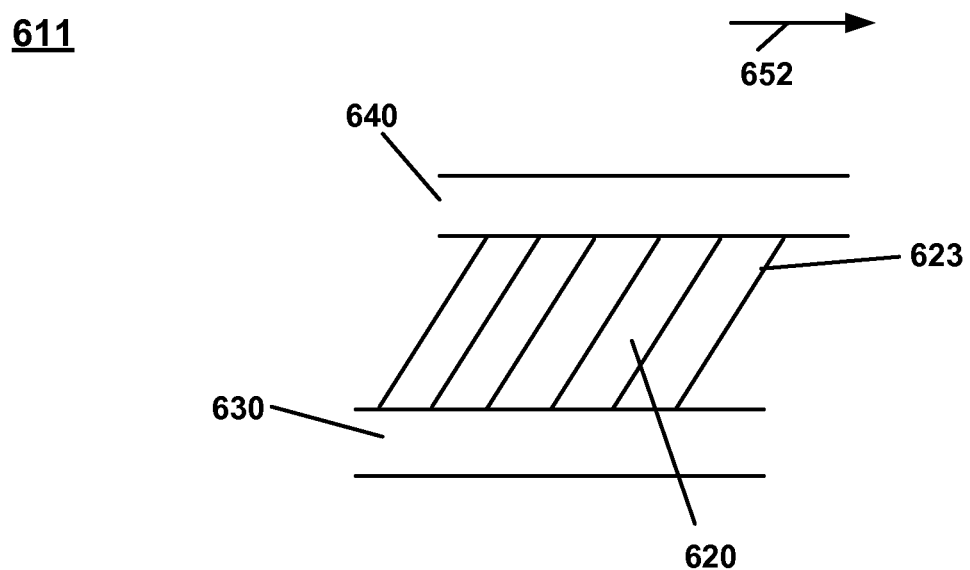
FIG. 6B is a block diagram of the nanowires of the optical cavity for color filtration of FIG. 6A in an off-optical axis position, in another embodiment of the present invention.

FIG. 6B is a block diagram of optical resonator 610 of FIG. 6A in which nanowires 620 are oriented in a non-parallel position 623, relative to the optical path. Non-parallelism of a nanowire 620 relative to the optical path causes a change in the optical paths through the nanowire filled optical cavity, resulting in a change in the effective refractive index.

In an embodiment of the present invention, an application of a voltage or sliding of substrate 640 in a lateral direction, indicated by arrow 652, has caused nanowires 620 to be oriented in an off-optical axis (non-parallel) position 623. Off-optical axis orientation of nanowires 620 provides color filtration, such that variations in the amount of off-optical axis orientation provide filtration of the RGB resonant frequencies.

Figure 7:
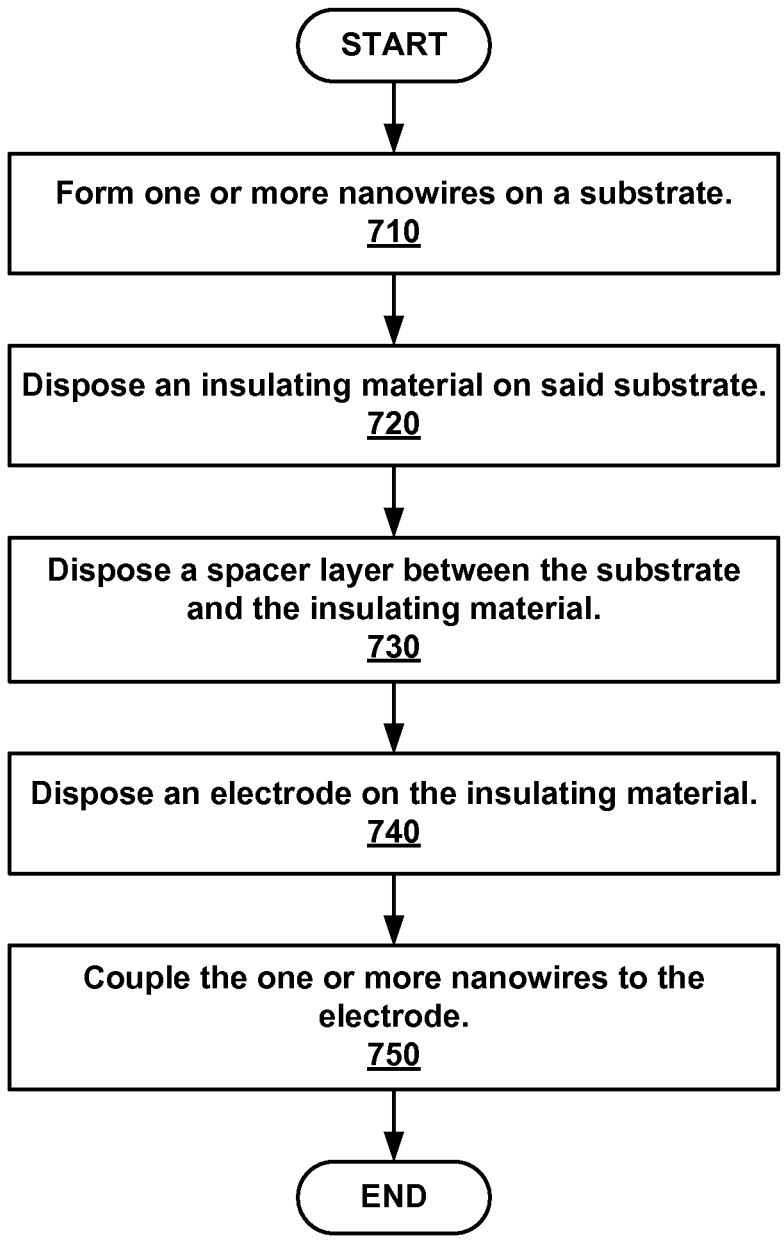
FIG. 7 is a flowchart of a process for fabricating an optical cavity having one or more tunable nanowires, in accordance with embodiments of the present invention.

FIG. 7 is a flowchart of a process 700 for fabrication of a device that includes one or more nanowires, in accordance with various embodiments of the present invention. FIG. 7 is a flow chart of a process 700 in which particular operations are performed in accordance with an embodiment of the present invention for device fabrication. Although specific operations are disclosed in process 700, such operations are exemplary. That is, the present invention is well suited to performing various other operations or variations of the operations recited in FIG. 7. Within the present embodiment, it should be appreciated that the operations of process 700 may be performed by software, by hardware, by an assembly mechanism, through human interaction, or by any combination of software, hardware, assembly mechanism, and human interaction.

Process 700 for device fabrication will be described with reference to components and devices shown in FIGS. 1A-1B, 2A-2B, 3A-3C, 4A-4B, 5A-5B, and 6A-6B in accordance with embodiments of the present invention.

In operation 710 of process 700, one or more nanowires 120, 220, 320, 420, 520 and 620 are formed on a substrate, e.g., electrode substrates 114 and 116, and substrates 230, 330, 430, 530, and 630 and 640, in an embodiment of the present invention. Nanowires may be grown on a substrate in a random arrangement, as depicted in FIG. 3A, in an embodiment of the present invention. In an alternative embodiment of the present invention, nanowires may be grown in an ordered pattern. Device 110, 210, 310, 410, 510 and 610 may be fabricated to include one or more nanowires in accordance with various embodiments of the present invention. Operation 710 may be performed in any manner similar to that described herein, but is not limited to such.

In operation 720 of process 700, an insulating material, e.g., insulator 340, may disposed on the substrate, as shown in FIG. 3, in an embodiment of the present invention. Operation 720 may be performed in any manner similar to that described herein, but is not limited to such.

In operation 730 of process 700, a spacer layer, e.g., spacer layer 335, may be formed between the substrate and the insulator, in an embodiment of the present invention. Operation 730 may be performed in any manner similar to that described herein, but is not limited to such.

In operation 740 of process 700, an electrode, e.g., electrode 214, 216, 314, 316, 414 or 416, may be formed on an insulator, e.g., insulator 340 of FIGS. 3B-3C, in an embodiment of the present invention. Operation 740 may be performed in any manner similar to that described herein, but is not limited to such.

In operation 750 of process 700, the one or more nanowires are coupled to one of the electrodes, e.g., electrode substrate 116 and electrodes 216, 316 and 416, as shown in FIGS. 1A-1B, 2A-2B, 3A-3B, respectively, in an embodiment of the present invention. Operation 750 may be performed in any manner similar to that described herein, but is not limited to such.

It is noted that subsequent to completion of operation 750, process 700 may be terminated or process 700 may be restarted, e.g., returns to operation 710 and is repeated.

Embodiments of the present invention, in the various presented embodiments, provide an apparatus and method for an optical resonant cavity having one or more nanowires.

The foregoing descriptions of specific embodiments of the present invention have been presented for purposes of illustration and description. They are not intended to be exhaustive or to limit the embodiments of the present invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A resonant cavity with tunable nanowire and comprising:
    a substrate, said substrate coupled with an optical resonator structure; and
    a plurality of nanowires formed on said substrate, wherein said plurality of nanowires is actuated in response to an application of energy, wherein said plurality of nanowires flex in response to said application of energy, and wherein light is refracted relative to an angle of deflection of a flex of said plurality of nanowires subsequent to said application of energy.

2. The resonant cavity as recited in claim 1 wherein said plurality of nanowires, when oriented parallel relative to an optical axis cause a high transmissive state.

3. The resonant cavity as recited in claim 1 wherein said plurality of nanowires, when oriented non-parallel relative to an optical axis cause a low transmissive state.

4. The resonant cavity as recited in claim 1 wherein said plurality of nanowires, when oriented non-parallel relative to an optical axis cause beam splitting.

5. The resonant cavity as recited in claim 1 wherein each nanowire in said plurality of nanowires comprise length adjustability, wherein length of said nanowire is at least one wavelength.

6. The resonant cavity as recited in claim 1 wherein said substrate further comprises:
    displacement variability for effecting a change in density of said plurality of nanowires.

7. The resonant cavity as recited in claim 1 wherein said substrate further comprises:
    positional variability for effecting change in orientation of said plurality of nanowires.

8. A method of refraction in an optical resonator comprising:
    applying energy to a plurality of nanowires, said plurality of nanowires formed on a substrate, said substrate coupled with a structure of an optical resonator;
    causing said plurality of nanowires to flex in response to said energy applied thereto; and
    refracting light relative to an angle of deflection of said flex of said plurality of nanowires subsequent to said applying energy.

9. The method as recited in claim 8 further comprising:
forming said plurality of nanowires such that a length of each nanowire of said plurality of nanowires is equivalent to more than one wavelength, wherein said length of said each nanowire is variable.

10. The method as recited in claim 8 further comprising:
varying density of said plurality of nanowires in response to said applying energy.

11. The method as recited in claim 8 wherein said refracting light further comprises:
positionally varying said substrate in response to said applying energy.

12. A method for optical cavity fabrication comprising:
forming a substrate;
forming one or more nanowires on said substrate; and
coupling said one or more nanowires to an electrode, said electrode coupled to said substrate, wherein said one or more of nanowires flex in response to energy applied thereto, and wherein light is refracted relative to an angle of deflection of said flex of said one or more nanowires subsequent to said applying energy.

13. The method as recited in claim 12 further comprising:
disposing an insulator between said substrate and said electrode.

14. The method as recited in claim 12 further comprising:
orienting said one or more nanowires between said electrode and another electrode, said another electrode coupled to said substrate.

15. The method as recited in claim 12 further comprising:
coupling a moveable portion to said substrate, said moveable portion affecting position of said one or more nanowires.

16. The method as recited in claim 12 further comprising:
coupling a moveable portion to said substrate, said moveable portion affecting length of said one or more nanowires.

* * * * *